United States Patent [19]

Delagrange

[11] 4,086,540
[45] Apr. 25, 1978

[54] TRANSLATING FILTER

[75] Inventor: Arthur D. Delagrange, Sykesville, Md.

[73] Assignee: The United States of America as represented by the Secretary of the Navy, Washington, D.C.

[21] Appl. No.: 767,020

[22] Filed: Feb. 9, 1977

[51] Int. Cl.² .................. H03B 1/04; H04B 15/00
[52] U.S. Cl. .................................. 328/167; 328/14; 328/160; 328/166; 328/133
[58] Field of Search ............... 328/165, 166, 167, 14, 328/160, 133

[56] References Cited

U.S. PATENT DOCUMENTS

| | | | |
|---|---|---|---|
| 3,384,824 | 5/1968 | Grenier | 328/166 X |
| 3,464,016 | 8/1969 | Kerwin et al. | 328/166 X |
| 3,619,789 | 11/1971 | Jager et al. | 328/166 X |
| 3,961,172 | 6/1976 | Hutcheon | 328/167 X |

Primary Examiner—John S. Heyman
Attorney, Agent, or Firm—R. S. Sciascia; A. L. Branning; R. E. Bushnell

[57] ABSTRACT

An a.c. coupled, low-pass translating filter in which quadrature phases of an input signal spectrum are, in three successive balanced modulator stages driven by quadrature phases of externally generated carrier signals, alternately modulated-up and demodulated-down, and the sum of the remaining spectra is, in a final stage, demodulated below the cutoff frequency. Each stage terminates with a low-pass filter in which odd harmonics of the carrier frequencies and double frequencies generated in the second and final stages are eliminated.

22 Claims, 32 Drawing Figures

* EACH STAGE HAS A BREAKPOINT FREQUENCY OF 1/10 OF THE PRECEDING STAGE

TRANSLATING FILTER

BACKGROUND OF THE INVENTION

This invention relates to the art of electronic signal filtering, and more particularly, to multi-stage spectral translation by alternate modulation and demodulation of an incurrent signal.

In presently available variable cutoff frequency electronic filters, the cutoff frequency is typically set by linear components, and is therefore limited by the accuracy of those components, usually plus or minus five percent. The attenuation of the stopband in these filters is basically proportional to either the frequency raised to some power if the filter is a low-pass design, or the inverse of the frequency raised to some power if it is a high pass design. Additionally, passband attenuation and ripple near the cutoff frequency, often on the order of 3dB, hinders performance.

SUMMARY OF THE INVENTION

The present invention provides an a.c. coupled, multi-stage, filter of the type having a single cutoff frequency, exhibiting a nearly square fall in amplitude of the spectrum at the selected cutoff frequency. Spectral translation techniques are used in the series coupled stages to first modulate quadrature phases of the incurrent spectra by quadrature phases of a carrier signal, then demodulate and again modulate the intermediate spectra by quardrature phases of the incremented frequency of the carrier signal, and finally demodulate the sum of the remaining spectra by the carrier frequency. As the cutoff frequency equals the difference between the frequencies of the incremented carrier signals applied to the intermediate stages and the carrier signals applied to the end stages, changing the amount of incrementation causes an equal change in the cutoff frequency. Throughout the remainder of this specification, the amount by which the carrier frequency modulating the intermediate stages is incremented will occasionally be referred to as the cutoff frequency of the multi-stage filter network.

As used herein, the phrase "quadrature modulation" indicates modulation of two incurrent signal components ninety degrees apart in phase by separate modulating functions. The phrase "balanced modulator" indicates a modulator, such as a push-pull circuit, in which the incurrent signal spectrum and modulating signal are so introduced that after modulation takes place the output contains the two sidebands without the carrier.

Accordingly, it is an object of the invention to provide a variable frequency filter.

It is another object of the invention to provide an electronic filter having a variable cutoff frequency.

It is yet another object of the invention to provide an electronic filter having a programmed cutoff frequency.

It is still yet another object of the invention to provide an electronic filter alterable to either the high-pass or low-pass mode of operation.

It is a further object of the invention to provide an electronic filter alterable to either the high-pass or low-pass mode of operation by selection of the phase difference between two modulation frequencies applied to the filter.

It is a yet further object of the invention to provide an electronic filter exhibiting a square attenuation of amplitude response beyond the cutoff frequency.

It is a still yet further object of the invention to provide an electronic filter having a variable cutoff frequency and exhibiting a square attenuation of amplitude response beyond the cutoff frequency.

It is also an object of the invention to provide an electronic filter having a variable cutoff frequency able to reject a closely spaced undesired frequency component adjacent to a desired frequency component.

BRIEF DESCRIPTION OF THE DRAWINGS

Other objects and many of the attendant advantages of the present invention will be readily appreciated as the same becomes better understood by reference to the following detailed description when considered in connection with the accompanying drawings wherein.

DETAILED DESCRIPTION OF THE INVENTION

Figure 1:
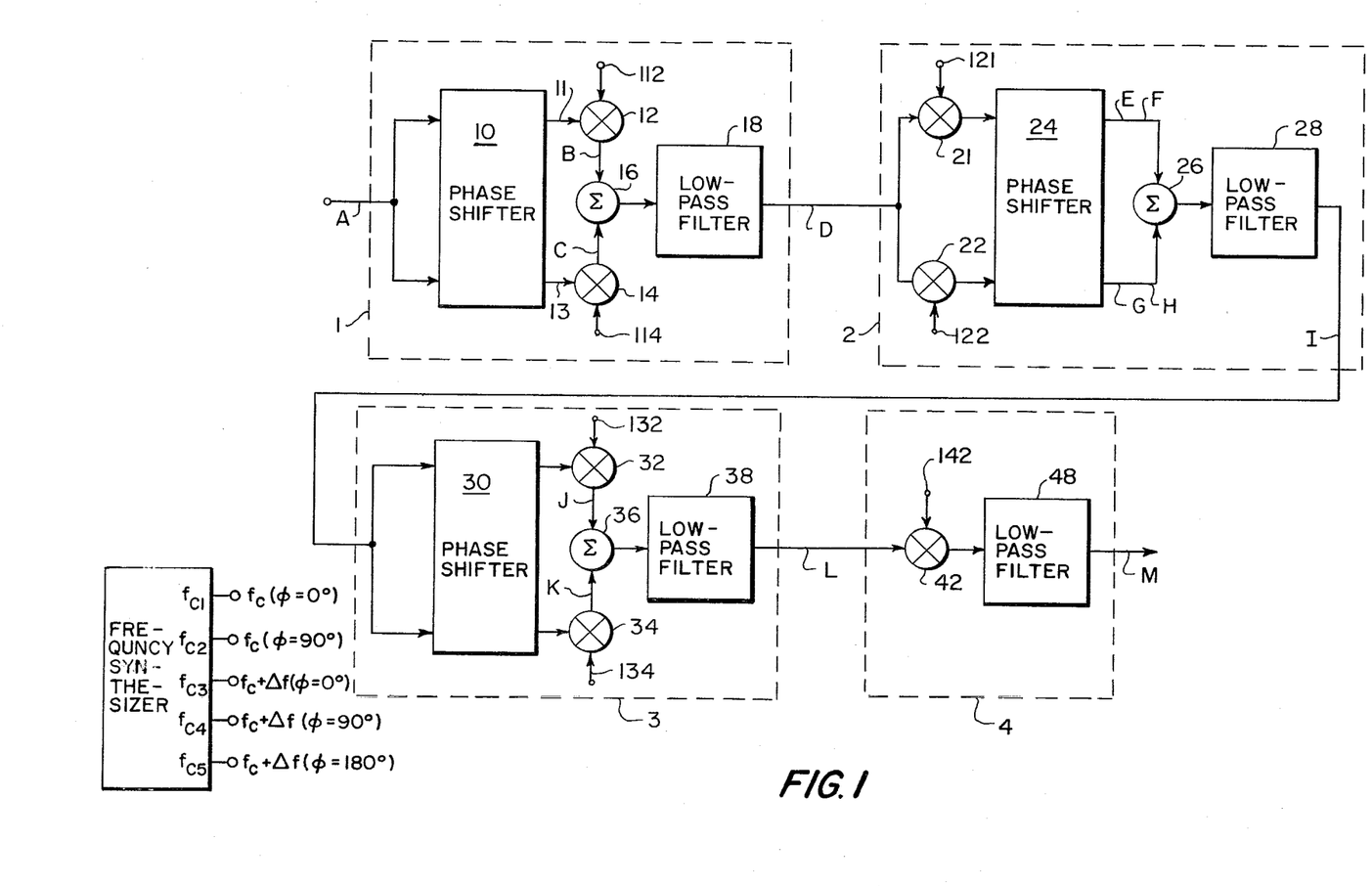
FIG. 1 sets forth in a single-line, rectangular box schematic, a diagram of one embodiment of the invention.

Refer now to the drawings, and in particular to FIG. 1 where a rectangular box schematic diagram of the circuit of an electronic filter of the type having a single, variable cutoff frequency is set forth. As shown, the translating filter is a network formed of four series coupled stages 1,2,3,4 driven by the modulation frequencies generated in a frequency synthesizer 50. Although driven by different modulation (i.e., "carrier") frequencies, the first and third stages 1,3 are structurally identical. In FIGS. 2A through 2M, the essential spectra of various signals are shown in an idealized manner with amplitudes normalized to unity, to illustrate the operation of the network set forth in FIG. 1. Harmonics occurring in the network at the points represented have been ignored as they are subsequently attenuated by the fixed low-pass filters 18, 28, 38, 48 and thus, do not effect the performance of the network.

Figure 2A:
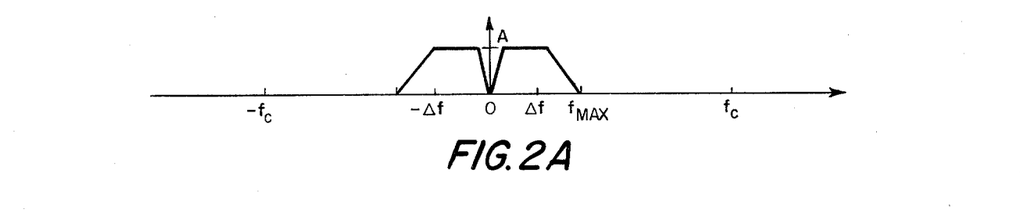
FIGS. 2A through 2M inclusive, set forth in an graphical manner, idealized representations of the normalized amplitude, frequency, and phase of signal spectra occurring at those labeled points of the diagram of FIG. 1 indicated by the last symbol of the figure number.
Figure 2B:
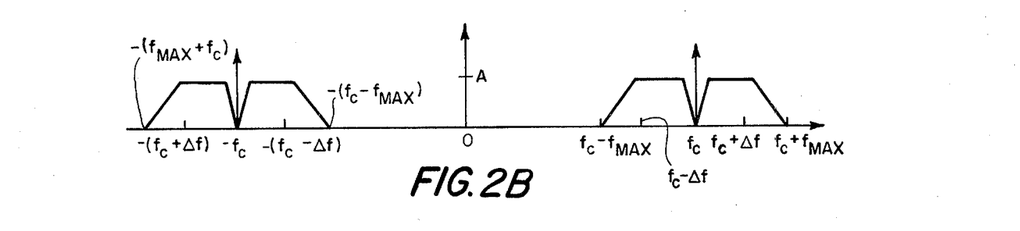
Figure 2C:
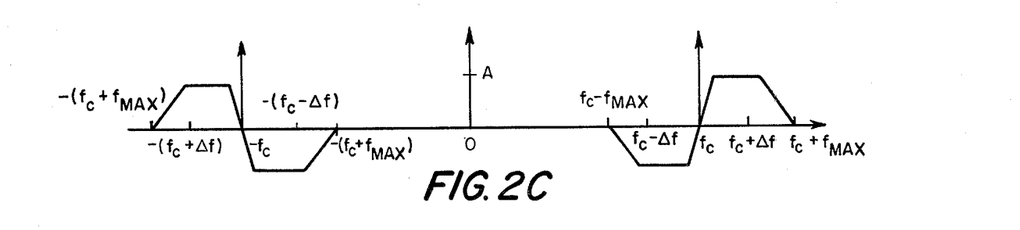
Figure 2D:
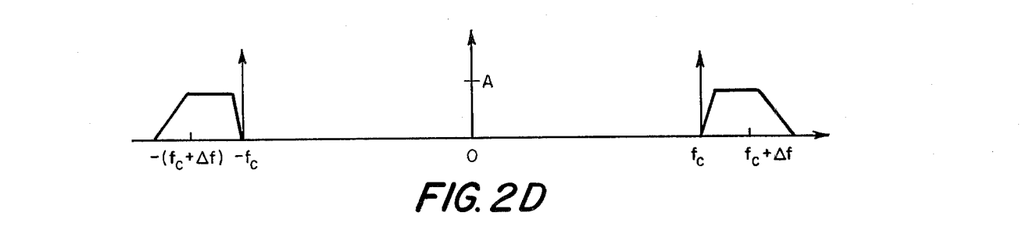
Figure 2E:
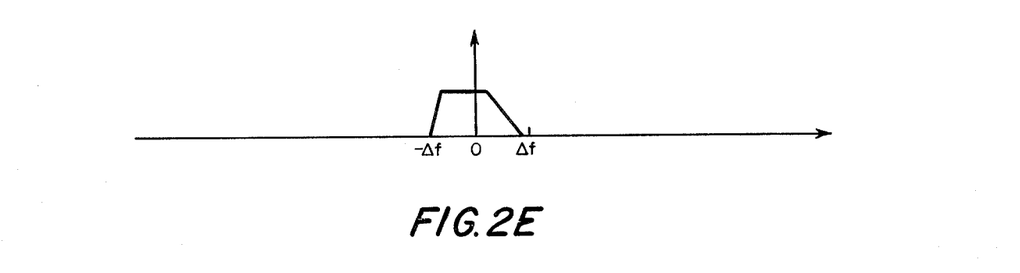
Figure 2F:
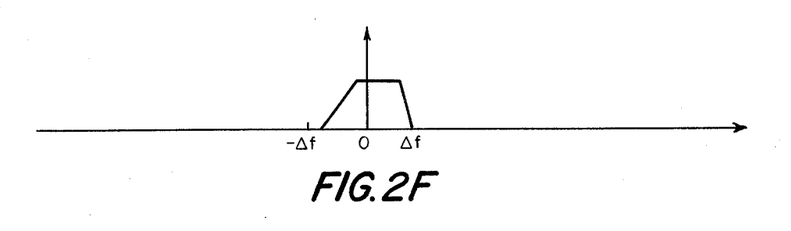
Figure 2G:
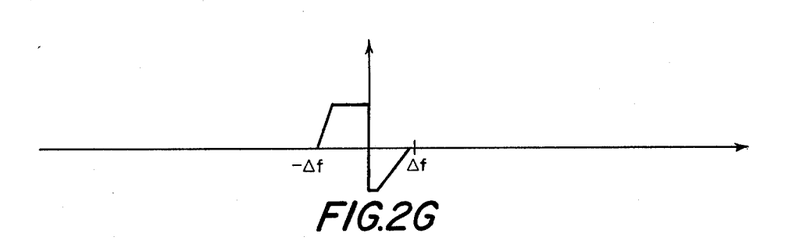
Figure 2H:
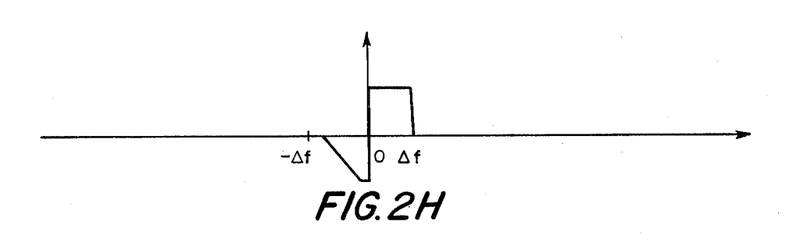
Figure 2I:
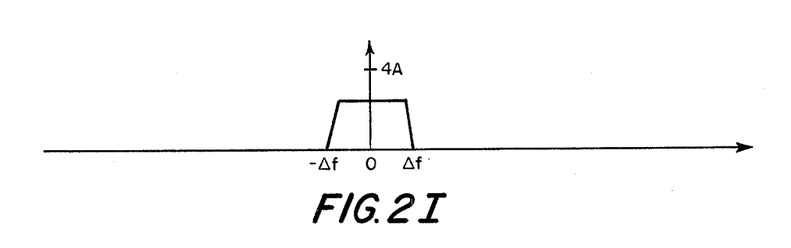

In the first stage 1, phase shifter 10 receives at point A an incurrent signal having a doubled-sided frequency spectrum such as that shown in FIG. 2A of the drawings, and delivers quadrature phases of the incurrent signal to balanced modulators 12, 14. To simplify this description, it will be assumed that the component frequencies of the spectra occurring in the lower channels following phase shifters 10, 24, 30 in the first, second and third stages of the filter network lead the same components in the spectra occurring in the parallel channels by approximately ninety degrees of phase angle. Modulators 12, 14 are driven via their base terminals 112, 114 repectively, by the first and second carrier frequency signals generated in frequency modulator 50. These carrier signals are quadrature phases of the carrier frequency $f_c$, with the first carrier signal, $f_{c1} = f_c$, $\phi = 0°$ lagging the second, $f_{c2} = f_c$, ($\phi = 90°$) by ninety degrees. The first and second carrier signals may be interchangeably applied to terminals 112, 114 without effecting the performance of the network. The output spectra delivered by the modulators 12, 14 at points B and C, are set forth in FIGS. 2B and 2C of the drawings, respectively. The amplitudes of the component frequencies of these spectra are added in summing amplifier 16. Since balanced modulators (i.e., square wave driven modulators) rather than linear multipliers are used, a low-pass filter 18 is used to eliminate harmonics generated at odd multiples of carrier frequency $f_c$. In one experiment a carrier frequency of ten kilo-Hertz was used. There, low-pass filter 18 had a twenty kilo-Hertz cutoff frequency. The spectrum delivered as the product of the first stage, shown in FIG. 2D, may be thought of as the spectrum of the incurrent signal shifted up in frequency by modulation with the carrier frequency and shorn of its mirror images through cancellation.

In the second stage 2, the product of the first stage is applied through parallel channels to balanced modulators 21, 22. The modulators 21, 22 are individually driven via their base leads 121, 122, respectively, by quadrature phases of an incremented carrier signal having a frequency $f_c + \Delta f$ equal to the sum of the carrier frequency and the desired network cutoff frequency, $\Delta f$. The spectrum delivered by the first stage is demodulated (i.e., modulated down) at the incremented carrier frequency, $f_c + \Delta f$ by modulators 21, 22, and shifted in phase by ninety degrees in phase shifter 24. Again it is assumed that the frequencies of the components of the spectrum passing through the lower channel are advanced in phase by ninety degrees with respect to the components in the upper channel. The sidebands of the spectrum passing through both channels at those points indicated by the last symbol of the figure are set forth in FIGS. 2E (upper sideband of the upper channel), 2F (lower sideband of the upper channel), 2G, (upper sideband of the lower channel) and 2F (lower sideband of the lower channel). The amplitudes of the component frequencies of both spectra are then added in summing amplifier 26, and passed through fixed low-pass filter 28 in order to eliminate the double-frequency components as well as the odd harmonics of the incremented carrier frequency. The product of the second stage, shown in FIG. 2I, may be thought of as the spectrum delivered by the first stage partially shifted through zero, that part of the spectrum not shifted through zero having been eliminated through cancellation upon the addition of the out-of-phase components. At point I, the filtering action is actually complete in that the delivered spectrum has no components above the cutoff frequency, $\Delta f$; however, the remaining part of the spectrum is reversed and shifted by $\Delta f$ beyond zero. Essentially, the incurrent signal spectrum has been compared with a reference by frequency differencing, and those components having a difference greater than zero have been removed. In the succeeding stages the remaining part of the incurrent signal will be returned to its original location in the frequency spectrum.

Figure 2J:
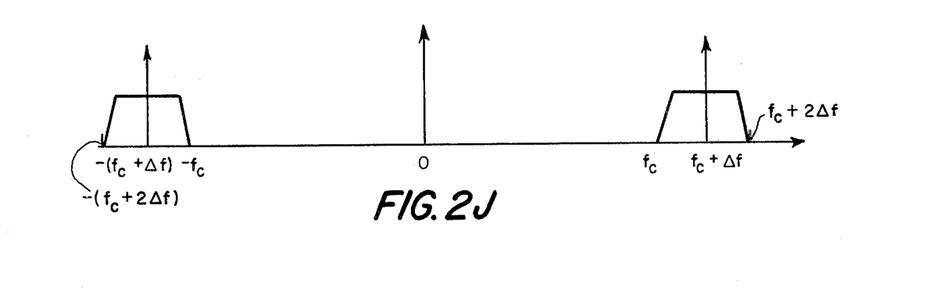
Figure 2K:
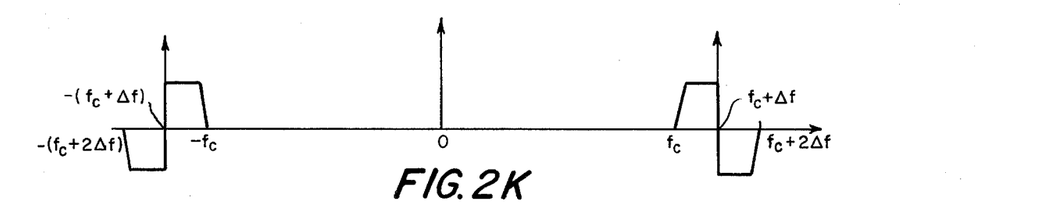
Figure 2L:
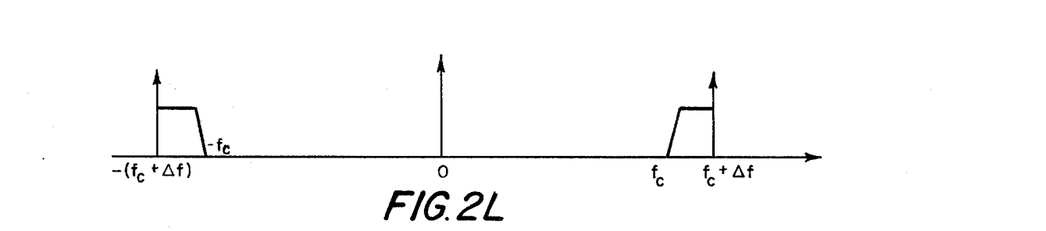
Figure 2M:
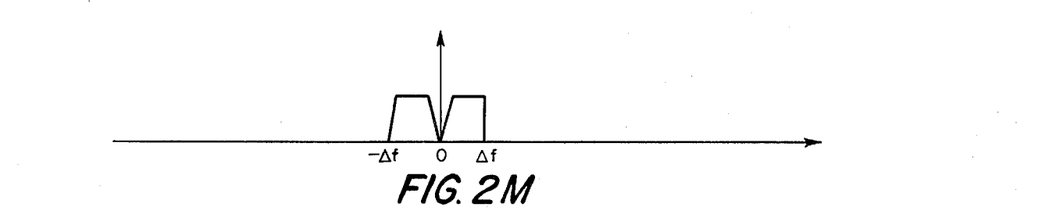

In the third stage 3, phase shifter 30 converts the spectrum delivered by the second stage 2 into a pair of quadrature phases and modulated up in frequency by a pair of balanced modulators 32, 34 coupled in series to different output channels of the phase shifter 30. Modulators 34, 32 are individually driven by different successive quadrature phases of the incremented carrier signal $f_c$ (e.g., $f_{c4}$ and $f_{c5}$) applied to their base terminals 134, 132 respectively. The spectra occurring at points J and K, shown respectively, in FIGS. 2J and 2K, are then added by summing amplifier 36 and passed through low-pass filter 38. The resulting spectrum, occurring between stages 3 and 4 at point L, and shown in FIG. 2L, is the desired part of the incurrent signal spectrum, although shifted up in frequency by the incremented carrier frequency, $f_c + \Delta f$. This spectrum is, in the final stage 4, shifted down in frequency (i.e., demodulated) by modulator 42 driven via its base terminal 142 by an arbitrary phase of carrier frequency $f_c$. The demodulated spectrum, then passed through low-pass filter 48, is shown in FIG. 2M.

The incremental carrier frequencies emanating from frequency synthesizer 50, $f_{c3} = f_c + \Delta f$, ($\phi = 0°$), $f_{c4} = f_c + \Delta f$ ($\phi = 90°$), and $f_{c5} = f_c + \Delta f$ ($\phi = 180°$), are separately applied to modulators 21, 22 in successive quadrature pairs. When the filter network is operated in the low-pass mode for example, carrier frequencies $f_{c5}$ and $f_{c4}$ are applied to the base terminals 121, 122 and 132, 134, respectively, of the modulator pairs 21, 22 and 32, 34 in stages 2 and 3. If operation in the high pass mode is desired, carrier frequency $f_{c3}$ may be substituted for $f_{c5}$.

Figure 3A:
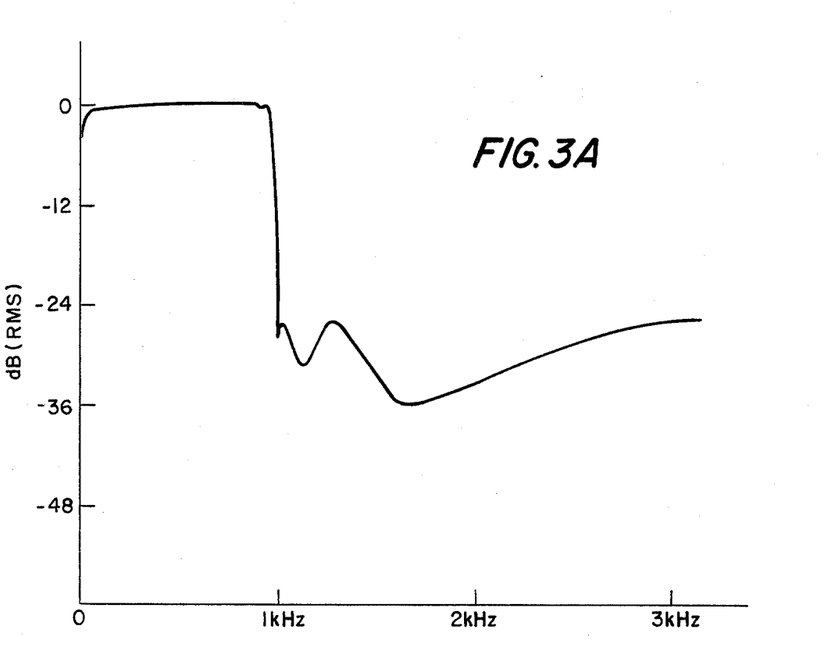
FIG. 3A sets forth in a graphical representation the response of the embodiment set forth in FIG. 1 operating in a low-pass mode with its cutoff frequency set at one kilo-Hertz, for sine wave input signals.
Figure 3B:
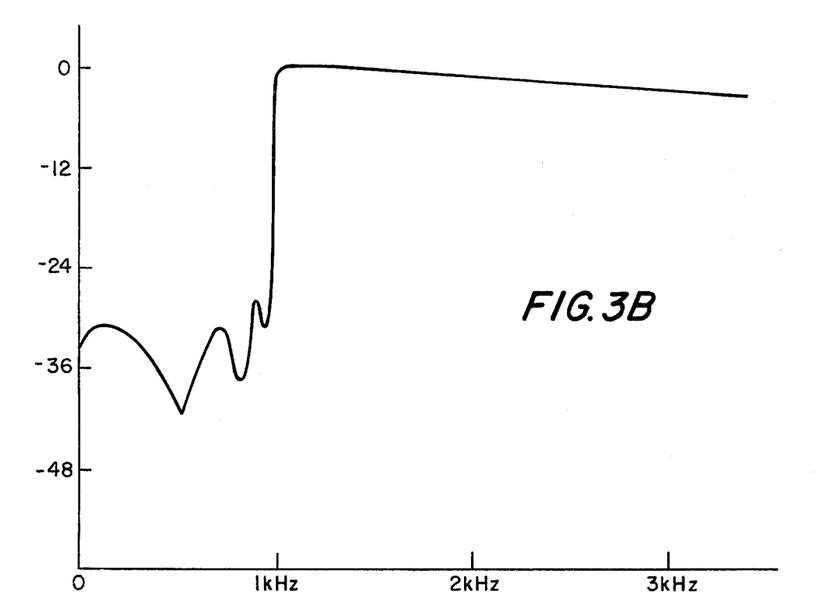
FIG. 3B sets forth in a graphical representation the response of the embodiment set forth in FIG. 1 operating in a high-pass mode with its cutoff frequency set at one kilo-Hertz, for sine wave input signals.
Figure 4A:
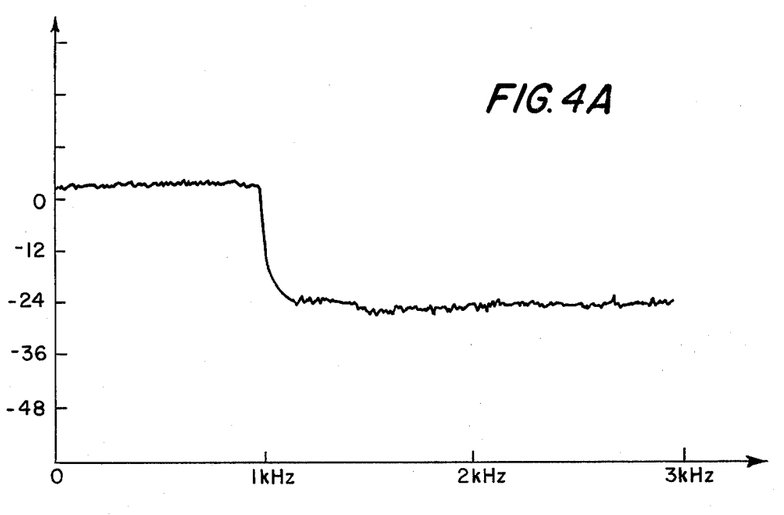
FIG. 4A sets forth in a graphical representation the output spectrum of the embodiment set forth in FIG. 1 operating in a low-pass mode with its cutoff frequency set at one kilo-Hertz, for a broadband noise input.
Figure 4B:
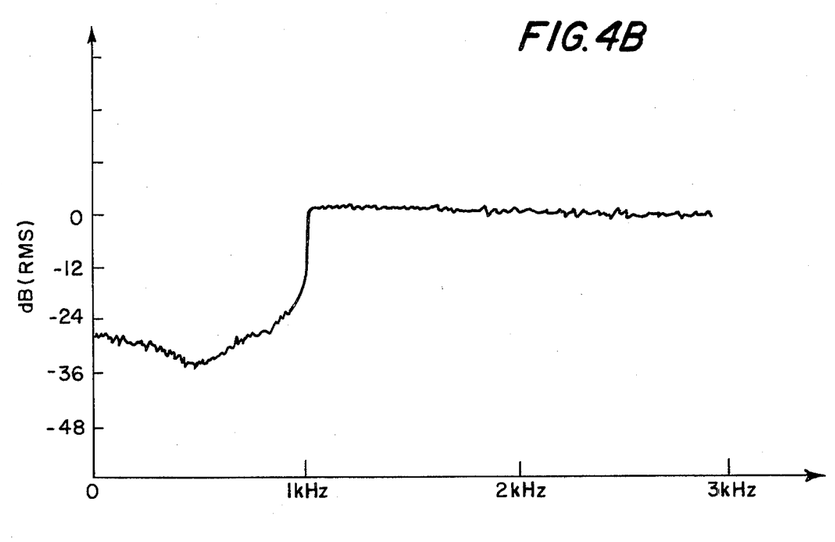
FIG. 4B sets forth in a graphical representation the output spectrum of the embodiment set forth in FIG. 1 operating in a high-pass mode with its cutoff frequency set at one kilo-Hertz, for a broadband noise input.
Figure 10:
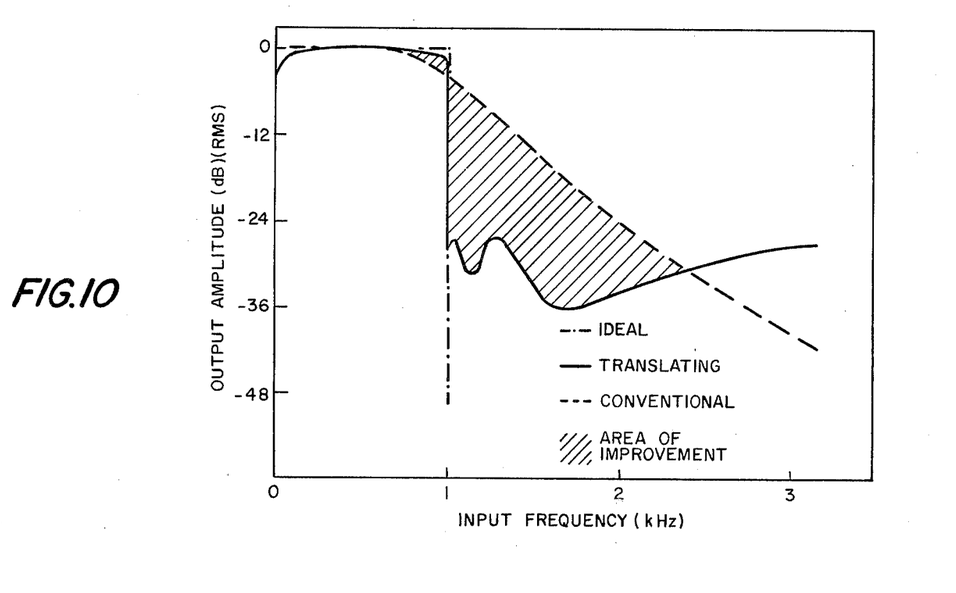
FIG. 10 sets forth in a graphical representation a comparison between the response of the embodiment shown in FIG. 1, a commerically obtainable prior art electronic filter, and an ideal electronic filter.

The foregoing description makes apparent the many attendant advantages of the present invention. It provides an electronic filter network of the type having a single cutoff frequency that not only allows facile variation of the cutoff frequency, but quickly switches from the low-pass to the high-pass mode. Additionally, this filter has an improved response. FIGS. 3A and 3B show the output amplitude in decibels (RMS) plotted as a function of the input frequency of a sine wave input signal for the filter operated in the low-pass and in the high-pass mode, respectively, with a one kilo-Hertz cutoff frequency. These graphs are not strictly transfer functions as the measured output is not always of the same frequency as the input. FIGS. 4A and 4B show the output amplitude in decibels plotted as a function of the ouput frequency for a broadband noise input, with the filter operated in the low-pass mode and in the high-pass mode, respectively, with a one kilo-Hertz cutoff frequency. From these graphs it may be seen that the frequency cutoff is inherently square; that attenuation in the stopband, achieved about one Hertz from the cutoff frequency, is basically fixed; and, that no inherent droop or ripple occurs in the passband. FIG. 10 where the output amplitude in decibels is plotted as a function of the input frequency, the response of an embodiment of the present invention is contrasted with that of the square response of an ideal filter and the gradual response of a typical commercially available filter (e.g., a Solid State Variable Filter Model 3200, manufactured by the Krohn-Hite Corporation of Cambridge, Mass., 02139). The improvement by the present invention upon the response of the prior art device is indicated by the cross-hatched area.

Figure 5:
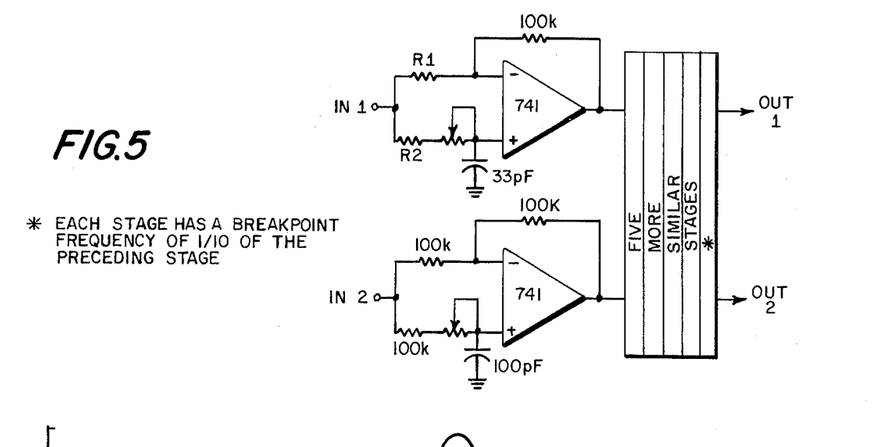
FIG. 5 sets forth in a schematic diagram a circuit of a typical phase shifter suitable for use in the embodiment shown in FIG. 1.
Figure 6:
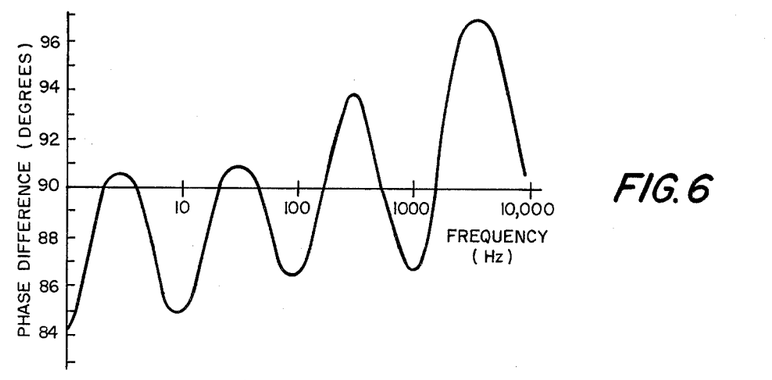
FIG. 6 presents in a logrythmic graph the deviation in phase difference between the two outputs of the circuit shown in FIG. 5 as a function of frequency.

Refer now to FIG. 5 where there is drawn a circuit schematic of a phase shifter of the type shown in FIG. 1 as elements 20, 24 and 30. It is formed of a chain of parallel pairs of all-pass network. Each all-pass has a gain of one and a phase shift that varies from zero at low frequency to ninety degrees at the breakpoint frequency, and then to one hundred and eighty degrees at high frequencies. Each pair exhibits a phase difference that peaks near ninety degrees between the breakpoint frequencies and falls to zero degrees above and below. Successive pairs have breakpoint frequencies spaced logarithmically at decade intervals, somewhat like a stagger-tuned filter. The over-all phase difference characteristic is graphically shown in FIG. 6. The deviation of this characteristic from the ideal ninety degrees causes incomplete sideband rejection and is the limiting factor for stopband attenuation and nonlinearity.

Figure 7:
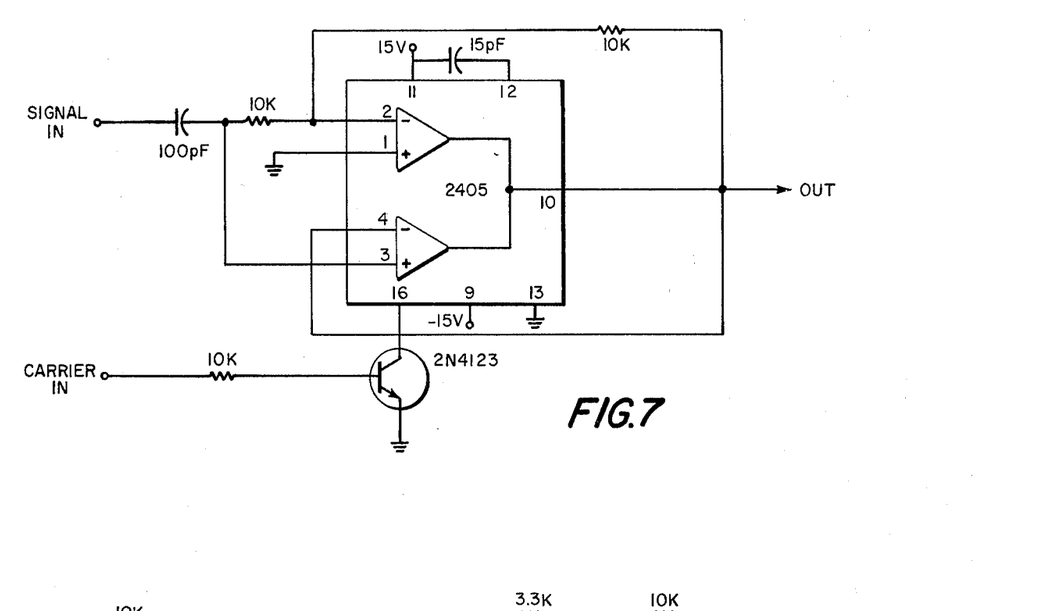
FIG. 7 sets forth in a schematic diagram a circuit of a typical balanced modulator suitable for use in the embodiment shown in FIG. 1.

FIG. 7 shows in a schematic diagram a circuit of a balanced modulator of the type shown in FIG. 1 as elements 12, 14; 21, 22; 32, 34; and 42. The modulators are assembled from programmable (i.e., selectable) operational amplifiers, with one connected as a unity-gain follower and the other as a unity gain inverter. While these elements are adequate at ten kilo-Hertz, high-speed balanced modulators (e.g., the 796 type) are required for a more general filter network operating at higher frequencies.

Figure 8A:
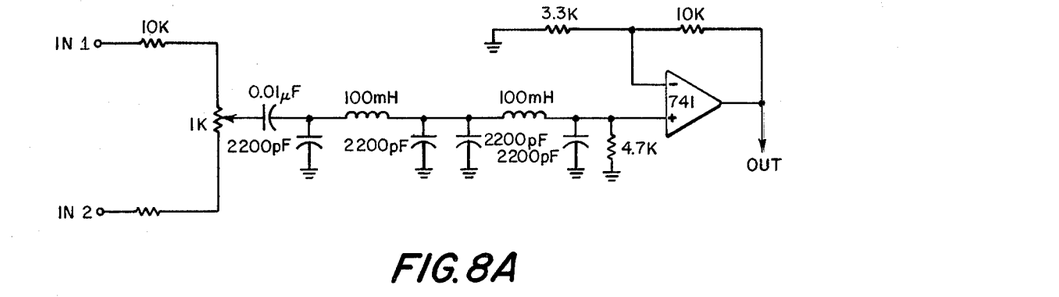
FIGS. 8A and 8B set forth in a schematic diagram a circuit of typical fixed low-pass filters suitable for use in the embodiment shown in FIG. 1.
Figure 8B:
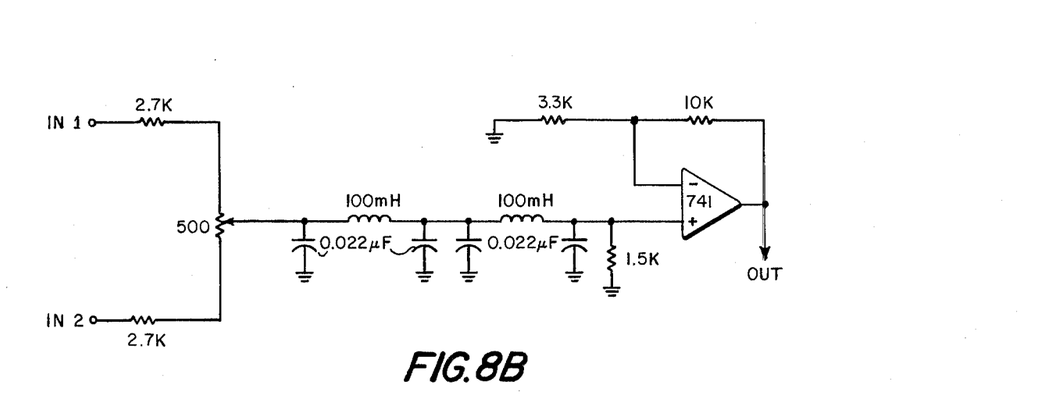

Low-pass filters 18, 28, 38 and 48 are used to remove harmonics and double frequency components. Typically these filters have a fixed cutoff frequency. Filters 18 and 38 have cutoff frequencies greater than the modulation frequency but less than its first harmonic. For example, a ten kilo-Hertz carrier frequency, filters 18 and 38 may have twenty kilo-Hertz cutoff frequencies. Filters 28 and 48, designed to eliminate double frequency components as well as harmonics of the modulation frequency, have a cutoff frequency greater than the maximum frequency of the spectrum of interest of the incurrent signal, $f_{MAX}$, but less than the modulation frequency. In the foregoing example, filters 28, 48 might have seven kilo-Hertz cutoff frequencies. Schematic diagrams of suitable filters (e.g., passive, constant-K ladder with an operation amplifier buffer at the output terminal) 18, 38 are shown in FIG. 8A, and filters 28, 48 are shown in FIG. 8B.

Figure 9:
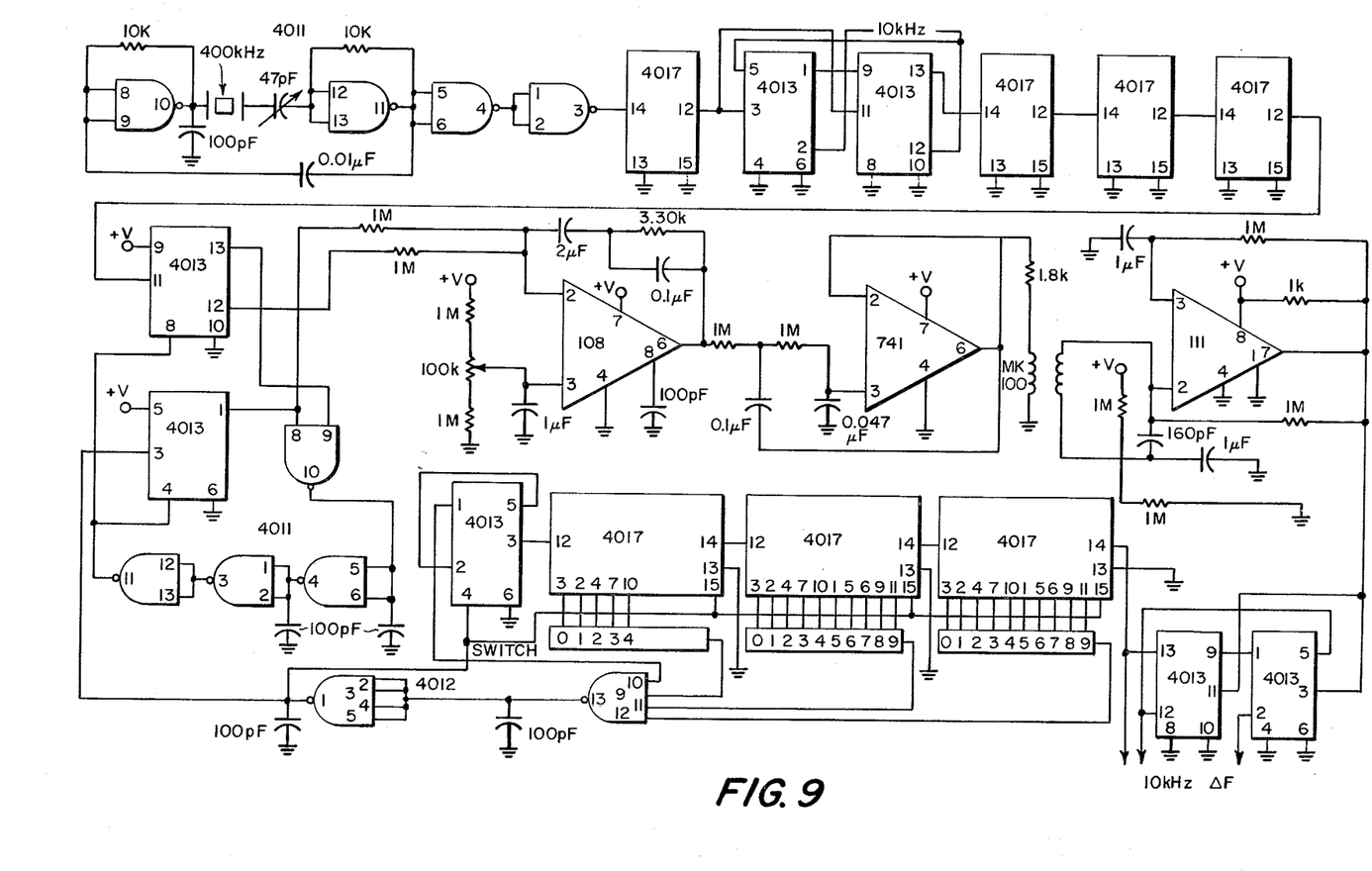
FIG. 9 sets forth in a schematic diagram the circuit of a typical frequency synthesizer suitable for use in the embodiment shown in FIG. 1.

FIG. 9 is a schematic diagram of a frequency synthesizer suitable for use as element 50 in FIG. 1. Its design is simple, relying upon CMOS logic. A four hundred kilo-Hertz crystal oscillator drives a counter chain, which provides reference frequencies of ten kilo-Hertz to ten Hertz. A self-acquiring phase-locked loop with a programmable divider chain is slaved to the ten Hertz signal. The programmable part of the divider chain divides by any number from 1000 to 1499, so the synthesizer may provide a modulation frequency from 10,000 to 14,990 Hertz in ten Hertz steps. The controlling switch simply reads the actual network cutoff frequency, 0 to 4,990 Hertz, quantized in ten Hertz steps.

Figure 11A:
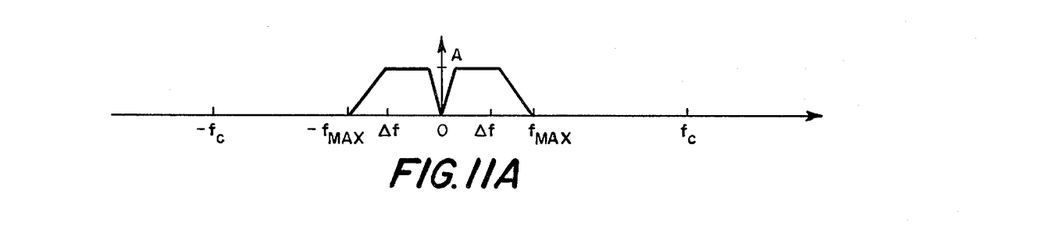
FIGS. 11A and 11B, and 11E through 11I inclusive, set forth in a graphical manner, idealized representations of the normalized amplitude, frequency, and phase of signal spectra occurring in an alternative embodiment to that shown in FIG. 1 at those labeled points on the diagram of FIG. 1 indicated by the last symbol of the figure number.
Figure 11B:
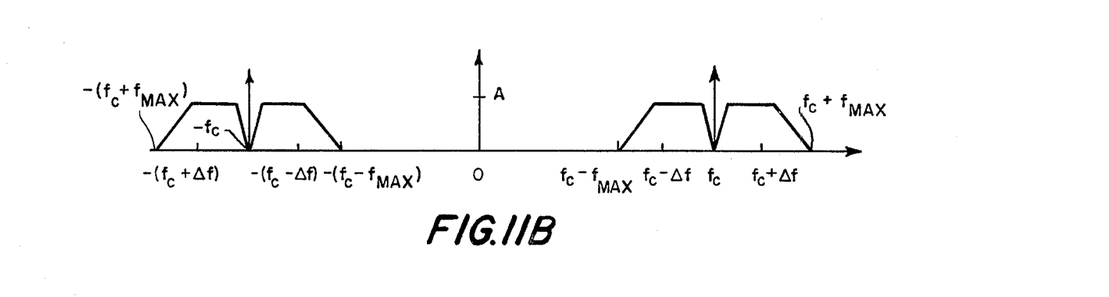
Figure 11E:
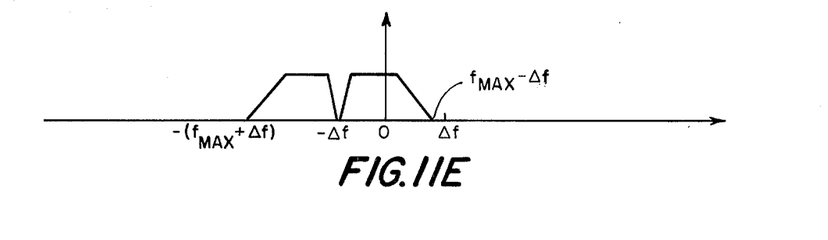
Figure 11F:
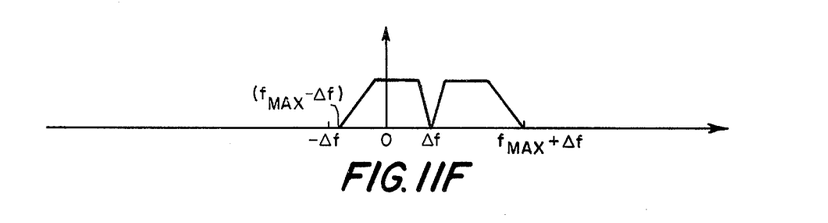
Figure 11G:
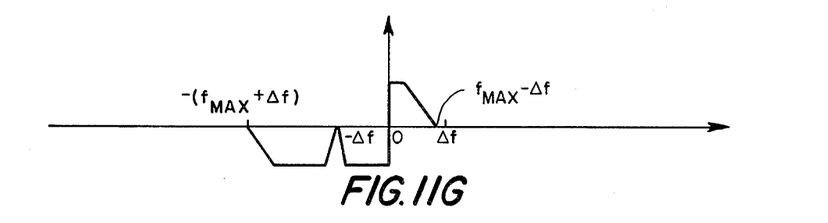
Figure 11H:
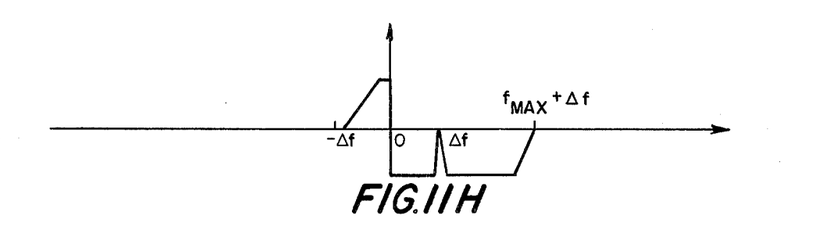
Figure 11I:
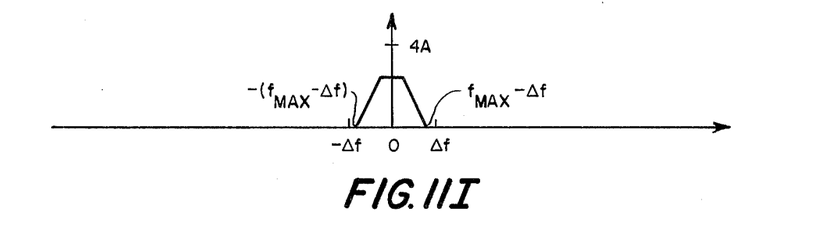

In the teachings of the foregoing paragraphs, the filter network is presented as a four stage system. An adequate response may be obtained from a two stage system however. In such a system the first stage 1' includes a modulator 12 driven by an aribitrary phase of the carrier frequency, $f_c$, applied via base terminal 112. The incurrent spectrum, shown in FIG. 11A, is, as shown in FIG. 11B, shifted up by modulation with the carrier frequency. The output of modulator 12 is passed through low-pass filter 18 to the second stage 2, where it is demodulated in previously described manner, and as illustrated by the spectral representations of the single sidebands in FIGS. 11E through 11H, inclusive. It should be noted that for the example shown there, the network is operated in the high-pass mode with modulator 21 driven by the zero phase of the incremented carrier signal $f_{c3}$ while modulator 22 is driven by the succeeding quadrature phase signal, $f_{c4}$. The resulting spectrum is shown in FIG. 11I.

The foregoing embodiments are merely illustrations of the basic principles of the invention. Obviously, numerous modifications and variations of the present invention are possible in light of the above teachings. For example, in FIG. 1, in the first stage 1, the leads 11, 13 between the parallel channels of the output of phase shifter 10 and balanced modulators 12 and 14 may be inverted, thereby changing the product delivered by the first stage and, depending upon the arrangement of leads between modulators and phase shifters in other stages as well as the phase relation between the carrier signals driving the modulators in any of the stages, modifying the spectrum of the signal delivered by the entire filter network. Obviously, the present invention may be practiced with different elements than those described herein. For example, the balanced modulators (driven by square wave signals) described in FIG. 7 may be replaced with an equivalent circuit of other design, or even with a multiplier driven by a sine wave signal.

Although the foregoing description has described the present invention and many of its attendant advantages in detail, an elaboration upon those details and advantages is presented in the 16th of February, 1976 edition of Electronic Design, Vol. 4, at page 156 et sequentes, the same being incorporated herein and made a part hereof.

What is claimed and desired to be secured by a Letters Patent of the United States is:

1. An electronic filter network of the type having a single cutoff frequency, $\Delta f$, comprising:
   in a first stage adapted for receiving a noisey incurrent signal having a spectrum of interest with a greatest frequency component, $f_{MAX}$, a circuit, comprising:

phase differencing means for providing at a pair of parallel channels quadrature phases of the components of said incurrent signal spectrum;

a pair of modulators each driven by a different quadrature phase of a carrier signal of frequency $f_c$, each coupled in series with a different one of said parallel channels and providing as an output, respectively the spectrum conveyed by its channel modulated at the frequency of the carrier signal, whereby the leading quadrature phase of said incurrent signal is modulated by the lagging quadrature phase of said carrier signal;

a summing amplifier coupled to receive the output of each of said pair of modulators; and, a low-pass filter having a low-pass cutoff frequency greater than $f_c + f_{MAX}$ and less than the first harmonic of $f_c$, for delivering as the product of the first stage a spectrum formed of the components of the response of said summing amplifier having frequencies less than the low-pass cutoff frequency;

in a second stage receiving quadrature phases of an incremented carrier signal of frequency $f_c + \Delta f$, a circuit, comprising:

a pair of modulators adapted to receive the product of said first stage, each driven by a different quadrature phase of said incremented carrier signal, and each delivering as an intermediate output the spectrum of the product of the first stage modulated at the frequency of said incremented carrier signal;

phase differencing means for providing through different channels of a pair of parallel channels, in response to reception of the intermediate output of each of said modulators quadrature phases of the component frequencies of the intermediate output, whereby the component frequencies of that intermediate output modulated by the incremented carrier signal having a quadrature phase closest to an integer multiple of one-half $\pi$ are advanced in phase by ninety degrees with respect to the same frequency components of the other intermediate output;

a summing amplifier coupled as a junction between said pair of parallel channels, for providing a single output spectrum; and, a low-pass filter having a low-pass cutoff frequency less than $f_c$ but greater than $\Delta f$, for delivering as the product of the second stage a spectrum formed of the components of the response of said summing amplifier having frequencies less than the low-pass cutoff frequency;

in a third stage receiving the same quadrature phases of said incremented carrier signal of frequency $f_c + \Delta f$, as those quadrature phases received by said second stage, a circuit, comprising:

phase differencing means for providing at a pair of parallel channels quadrature phases of the components of the product of said second stage;

a pair of modulators each driven by a different quadrature phase of said incremented carrier signal, each coupled in series with a different one of said parallel channels and providing as an output, respectively the spectrum conveyed by its channel modulated at the frequency of the incremented carrier signal whereby the leading quadrature phase of said intermediate output is modulated by that incremented carrier signal having a quadrature phase closest to an integer multiple of one-half $\pi$ with respect to the quadrature phase of the other carrier signal;

a summing amplifier coupled to receive the output of each of said pair of modulators; and, a low-pass filter having a low-pass cutoff frequency greater than $f_c + f_{MAX}$ and less than the first harmonic of $f_c + \Delta f$, for delivering as the product of the third stage a spectrum formed of the components of the response of said summing amplifier having frequencies less than the low-pass cutoff frequency;

in a fourth stage receiving a carrier signal of frequency $f_c$, a circuit, comprising:

a modulator adapted to receive the product of said third stage and driven by said carrier signal to deliver as an intermediate output the spectrum of the product of said third stage modulated at the frequency of said carrier signal; and, a low-pass filter having a low-pass cutoff frequency less than $f_c$ but greater than $\Delta f$, coupled to recieve the response of said modulator.

2. An electronic filter network of the type set forth in claim 1, further comprising:

in the second stage, the incremented carrier signal having a quadrature phase closest to an integer multiple of one-half $\pi$ lagging with respect to the phase of the other incremented carrier signal; and, in the third stage, the incremented carrier signal having a quadrature phase closest to an integer multiple of one-half $\pi$ lagging with respect to the phase of the other incremented carrier signal.

3. An electronic filter network of the type set forth in claim 1, further comprising:

in the second stage, the incremented carrier signal having a quadrature phase closest to an integer multiple of nne-half $\pi$ leading with respect to the phase of the other incremented carrier signal; and, in the third stage, the incremented carrier signal having a quadrature phase closest to an integer multiple of one-half $\pi$ leading with respect to the phase of the other incremented carrier signal.

4. An electronic filter network of the type set forth in claim 1 wherein said modulators comprise balanced modulators.

5. An electronic filter network of the type having a single cutoff frequency, $\Delta f$, comprising:

a frequency synthesizer for providing first and second carrier signals of frequency $f_c$ differing in phase by ninety degrees, and third, fourth, and fifth incremented carrier signals of frequency $f_c + \Delta f$ differing in phase with ordinal progression by ninety degrees;

in a first stage adapted for receiving a noisey incurrent signal having a spectrum of interest with a greatest frequency component, $f_{MAX}$, a circuit, comprising:

phase differencing means for providing at a pair of parallel channels quadrature phases of the components of said incurrent signal spectrum;

a pair of modulators each driven by a different one of the first and second carrier signals and each coupled in series with a different one of said parallel channels and providing as an output, respectively the spectrum conveyed by its channel modulated at the frequency of the carrier signal;

a summing amplifier coupled to receive the output of each of the modulators; and, a low-pass filter having a low-pass cutoff frequency greater than $f_c + f_{MAX}$ and less than the first harmonic of $f_c$, for delievering as the product of the first stage a spectrum formed of the components of the response of said summing amplifier having frequencies less than the low-pass cutoff frequency;

in a second stage receiving quadrature phases of the incremented carrier signal of frequency $f_c + \Delta f$, a circuit, comprising:

a parallel pair of modulators adapted to receive the product of said first stage, the first of the modulators driven by the fourth, while the other of the modulators is driven by the other, of the incremented carrier signals, each modulator delivering as an intermediate output the spectrum of the product of the first stage modulated at the frequency of said incremented carrier signals;

phase differencing means for advancing by ninety degrees the phase of component frequencies of the intermediate output delivered by the first of the modulators;

a summing amplifier for providing a single output spectrum in response to reception of each intermediate output; and, a low-pass filter having a low-pass cutoff frequency less than $f_c$ but greater than $\Delta f$, for delivering as the product of the second stage a spectrum formed of the components of the response of said summing amplifier having frequencies less than the low-pass cutoff frequency;

in a third stage receiving the same of said incremented carrier signals as those received in said second stage, a circuit, comprising:

phase differencing means for providing at a pair of parallel channels quadrature phases of the components of the product of said second stage;

a pair of modulators each driven by a different one of said incremented carrier signals, each coupled in series with a different one of said parallel channels, and each providing as an output the spectrum conveyed by its channel modulated at the frequency of the incremented carrier signal whereby the lagging quadrature phase of the components of the product of said second stage is modulated by the fourth of said incremented carrier signals;

a summing amplifier coupled to receive the output of each of the pair of modulators; and, a low-pass filter having a low-pass cutoff frequency greater than $f_c + f_{MAX}$ but less than the first harmonic of $f_c + \Delta f$, for delivering as the product of the third stage a spectrum formed by the components of the response of the summing amplifier having frequencies less than the low-pass cutoff frequency;

in a fourth stage receiving a carrier signal of frequency $f_c$, a circuit, comprising:

a modulator adapted to receive the product of said third stage and driven by said carrier signal to deliver as an intermediate output the spectrum of the product of said third stage modulated at the frequency of said carrier signal; and, a low-pass filter having a low-pass cutoff frequency less than $f_c$ but greater than $\Delta f$, coupled to recieve the response of said modulator.

6. An electronic filter network of the type set forth in claim 5, further comprising:

in the second and third stages, the fourth of said incremented carrier signals lagging with respect to the other of said incremented carrier signals.

7. An electronic filter network of the type set forth in claim 5, further comprising:

in the second and third stages, the fourth of said incremented carrier signals leading with respect to the other of said incremented carrier signals.

8. An electronic fitler network of the type set forth in claim 5, further comprising:

in the first stage, the leading quadrature phase of said incurrent signal being modulated by the lagging of said first and second carrier signals.

9. An electronic filter network of the type set forth in claim 8, further comprising:

in the second and third stages, the fourth of said incremented carrier signals lagging with respect to the other of said incremented carrier signals.

10. An electronic filter network of the type set forth in claim 8, further comprising:

in the second and third stages, the fourth of said incremented carrier signals leading with respect to the other of said incremented carrier signals.

11. An electronic filter network of the type set forth in claim 5, further comprising:

in the first stage, the leading quadrature phase of said incurrent signal being modulated by the leading of said first and second carrier signals.

12. An electronic filter network of the type having a single cutoff frequency, $\Delta f$, comprising:

in a first stage adapted for receiving a noisey incurrent signal having a spectrum of interest with a most extreme frequency component, $f_{MAX}$, a circuit, comprising:

a first modulator driven by a carrier signal of frequency $f_c$, providing as an output the spectrum of the incurrent signal modulated at the frequency of the carrier signal; and, a filter having a cutoff frequency greater than $f_c + f_{MAX}$ but less than the first harmonic of $f_c$, for delivering as the product of the first stage a spectrum formed of components of the modulated incurrent signal having frequencies less than the lowpass cutoff frequency;

in a second stage receiving quadrature phases of an incremented carrier signal of frequency $f_c + \Delta f$, a circuit, comprising:

a parallel pair of modulators adapted to receive the product of said first stage, a first of the modulators driven by a first phase of the incremented carrier signal of frequency $f_c + \Delta f$, while the other of the modulators is driven by a second and quadrature phase of the first incremented carrier frequency, each modulator delivering as an intermediate output the spectrum of the product of the first stage modulated at the frequency of said incremented carrier signal;

phase differencing means for advancing by ninety degrees the phase of the component frequencies of the intermediate output delivered by the first of the modulators;

an amplifier for providing a single output spectrum in response to reception of each intermediate output; and, filter means having a cutoff frequency less than $f_c$ but greater than $\Delta f$, for delivering as the output of the second stage a spectrum formed of the components of the response of the amplifier having frequencies less than the cutoff frequency.

13. An electronic filter network of the type set forth in claim 12 wherein the first phase of the incremented carrier signal leads the second phase, further comprising:

in a third stage driven by the same quadrature phases of said incremented carrier signal as those driving said second stage, a circuit comprising:
phase differencing means for providing at a pair of parallel channels two quadrature phases of the components of the product of said second stage;
a modulator driven by the first quadrature phase of said incremented carrier signal for providing an output by modulating the leading of the two quadrature phases;
a modulator driven by the second quadrature phase of said incremented carrier signal for providing an output by modulating the lagging of the two quadrature phases; an amplifier coupled to receive the output of each modulator; and,
a filter having a cutoff frequency greater than $f_c + f_{MAX}$ but less than the first harmonic of $f_c + \Delta f$, for delivering as the product of the third stage a spectrum formed by the components of the response of the amplifier having frequencies less than the cutoff frequency;

in a fourth stage receiving a carrier signal of frequency $f_c$, a circuit, comprising:
a modulator driven by said carrier signal to deliver an intermediate output by modulating the spectrum of the product of said third stage; and,
a filter having a cutoff frequency less than $f_c$ but greater than $\Delta f$, coupled to receive the intermediate output of said modulator.

14. An electronic filter network of the type set forth in claim 12 wherein the first phase of the incremented carrier signal lags the second, further comprising:

in the first stage:
a second modulator in parallel with the first modulator and driven by a quadrature phase of said carrier signal, for providing as an output the spectrum of the incurrent signal modulated at the frequency of the carrier signal; and,
an amplifier coupled before said filter, to receive the output of the first and second modulators;

in a third stage driven by the same quadrature phases of said incremented carrier signal as those driving said second stage, a circuit comprising:
phase differencing means for providing at a pair of parallel channels two quadrature phases of the components of the product of said second stage;
a modulator driven by the first quadrature phase of said incremented carrier signal for providing an output by modulating the leading of the two quadrature phases;
a modulator driven by the second quadrature phase of said incremented carrier signal for providing an output by modulating the lagging of the two quadrature phases; an amplifier coupled to receive the output of each modulator; and,
a filter having a cutoff frequency greater than $f_c + f_{MAX}$ but less than the first harmonic of $f_c + \Delta f$, for delivering as the product of the third stage a spectrum formed by the components of the response of the amplifier having frequencies less than the cutoff frequency;

in a fourth stage receiving a carrier signal of frequency $f_c$, a circuit, comprising:
a modulator driven by said carrier signal to deliver an intermediate output by modulating the spectrum of the product of said third stage; and,
a filter having a cutoff frequency less than $f_c$ but greater than $\Delta f$, coupled to receive the intermeidate output of said modulator.

15. An electronic filter network, comprising:
first quadrature modulation means driven by quadrature phases of a carrier signal of frequency $f_c$, and adapted to receive a noisey incurrent signal having a spectrum of interest with a greatest frequency component, $f_{MAX}$, for providing as an initial response the sum of quadrature phases of the incurrent signal modulated at the carrier frequency;

first filter means having a cutoff frequency greater than $f_c + f_{MAX}$ but less than the first harmonic of $f_c$, for delivering as an initial product a spectrum formed by components of the initial response with frequencies less than the cutoff frequency of the first filter means;

second quadrature modulation means driven by a first and a second quadrature phase of an incremental carrier signal of frequency $f_c + \Delta f$, for providing as a medial response the sum of quadrature phases of the modulated product of the first filter means, the product of the first filter means modulated by the first quadrature phase of the incremental carrier signal having been subsequently advanced in phase by ninety degrees with respect to the product modulated by the second quadrature phase of the incremented carrier signal;

second filter means having a cutoff frequency less than $f_c$ but greater than $\Delta f$, for delivering as a product a spectrum formed by components of the medial response with frequencies less than the cutoff frequency of the second filter means;

third quadrature modulation means driven by said first and second quadrature phases, for providing as an intermediate response the sum of quadrature phases of the product of the second filter means modulated at the incremented carrier frequency after modulating the leading quadrature phase of the product of the second filter means by said first quadrature phase;

third filter means having a cutoff frequency greater than $f_c + f_{MAX}$ but less than the first harmonic of $f_c + \Delta f$, for delivering as a product a spectrum formed by components of the intermediate response with frequencies less than the cutoff frequency of the third filter means;

single modulation means driven by said carrier signal, for providing a final output by modulating the product of said third filter means; and, fourth filter means having a cutoff frequency less than $f_c$ but greater than $\Delta f$, coupled to receive the final output.

16. An electronic filter network as set forth in claim 15 wherein said first quadrature modulation means comprises:

phase differencing means for providing at a pair of parallel channels quadrature phases of the components of said incurrent signal spectrum;

a pair of modulators each driven by a different quadrature phase of said carrier signal, each coupled in series with a different one of said parallel channels, and each providing as an initial output the spectrum conveyed by its channel modulated at the carrier frequency; and, a summing amplifier coupled to provide the initial response by receiving the output of each of the modulators.

17. An electronic filter network as set forth in claim 16 wherein the leading quadrature phase of said incurrent signal is modulated by the lagging quadrature phase of said carrier signal.

18. An electronic filter network as set forth in claim 16 wherein the leading quadrature phase of said incurrent signal is modulated by the leading quadrature phase of said carrier signal.

19. An electronic filter network as set forth in claim 15 wherein said second quadrature modulation means comprises:

a parallel pair of modulators individually driven by said first and second quadrature phases, each adapted to receive the initial product, each modulator delivering as a medial output the spectrum of the initial product modulated at the incremented carrier frequency;

phase differencing means coupled to receive the medial output; and, a summing amplifier for providing a single medial response upon reception of each medial output from the phase differencing means.

20. An electronic filter network as set forth in claim 19 wherein said first quadrature phase leads said second quadrature phase.

21. An electronic filter network as set forth in claim 19 wherein said first quadrature phase lags said second quadrature phase.

22. An electronic filter network as set forth in claim 19 wherein each of said pair of parallel modulators comprise a balanced modulator.

* * * * *